(12) United States Patent
Devoe et al.

(10) Patent No.: US 6,366,443 B1
(45) Date of Patent: *Apr. 2, 2002

(54) CERAMIC CHIP CAPACITOR OF CONVENTIONAL VOLUME AND EXTERNAL FORM HAVING INCREASED CAPACITANCE FROM USE OF CLOSELY-SPACED INTERIOR CONDUCTIVE PLANES RELIABLY CONNECTING TO POSITIONALLY-TOLERANT EXTERIOR PADS THROUGH MULTIPLE REDUNDANT VIAS

(76) Inventors: Daniel Devoe, 1106 Barcelona, San Diego, CA (US) 92107; Alan D. Devoe, 5715 Waverly Ave., La Jolla, CA (US) 92037; Lambert Devoe, 26213 Via Luis, Laguna Niguel, CA (US) 92607

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/987,463

(22) Filed: Dec. 9, 1997

(51) Int. Cl.⁷ .............................. H01G 4/06; H01G 4/20; H01G 4/005
(52) U.S. Cl. ..................... 361/313; 361/321.2; 361/303
(58) Field of Search .................. 361/301.1, 302, 361/303, 306.1, 306.3, 307, 311, 312, 313, 320, 321.1, 321.2, 321.3, 321.4, 321.5

(56) References Cited

U.S. PATENT DOCUMENTS

| | | | | |
|---|---|---|---|---|
| 4,439,813 A | * | 3/1984 | Dougherty et al. | 361/321 |
| 4,819,128 A | * | 4/1989 | Florian et al. | 361/321 |
| 4,864,465 A | * | 9/1989 | Robbins | 361/320 |
| 5,177,663 A | * | 1/1993 | Ingleson et al. | 361/321 |
| 5,220,483 A | * | 6/1993 | Scott | 361/313 |
| 5,576,926 A | | 11/1996 | Monsorno | 361/303 |
| 5,590,016 A | * | 12/1996 | Fujishiro et al. | 361/313 |
| 5,599,414 A | * | 2/1997 | Roethlingshoefer | 156/89 |
| 5,712,758 A | * | 1/1998 | Amano et al. | 361/321.2 |
| 5,757,611 A | * | 5/1998 | Gurovich et al. | 361/321.4 |
| 5,855,995 A | * | 1/1999 | Haq et al. | 438/210 |

* cited by examiner

Primary Examiner—Anthony Dinkins
Assistant Examiner—Eric Thomas
(74) Attorney, Agent, or Firm—Wood, Herron & Evans, L.L.P.

(57) ABSTRACT

A ceramic capacitor typically 10 mils to 340 mils square by typically 4–20 mils thickness with areas of metallization, or pads, to which electrical connections may be made on, typically, each of two opposite exterior surfaces, has embedded at least one, and normally two or more, metallization planes at close, typically 0.5 mil, separation. Each interior metallization plane connects through multiple redundant vias, as are preferably made by (ii) punching, (ii) drilling, (iii) laser drilling, or (iv) radiation patterning of a green ceramic sheet having a photosensitive binder, to an associated surface pad or trace. The vias are both numerous and redundant, typically being of 2 mil diameter on 10 mil centers in a pin grid array pattern over and through entire ceramic layers of the capacitor, permitting both (i) easy fabrication without exacting alignment or registration between layers, and (ii) low Equivalent Series Resistance (ESR) in the finished capacitor. The composite structure so created exhibits increased capacitance over that which would alternatively exist should no electrically-connected interior metallization planes be present.

28 Claims, 6 Drawing Sheets

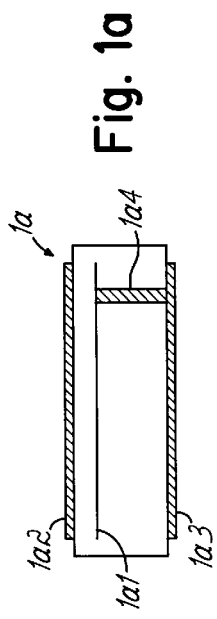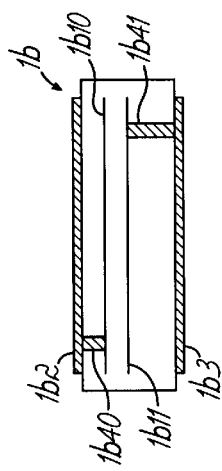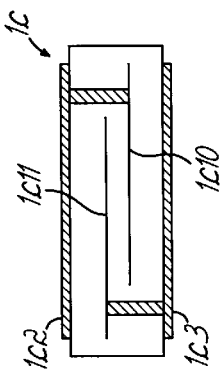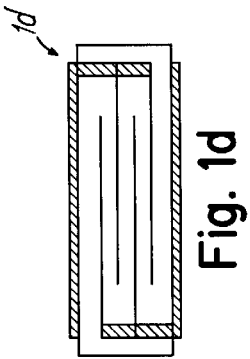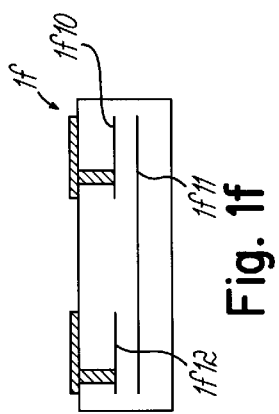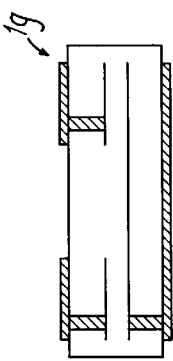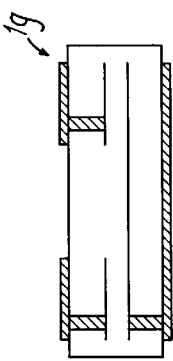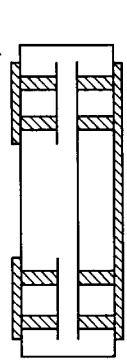

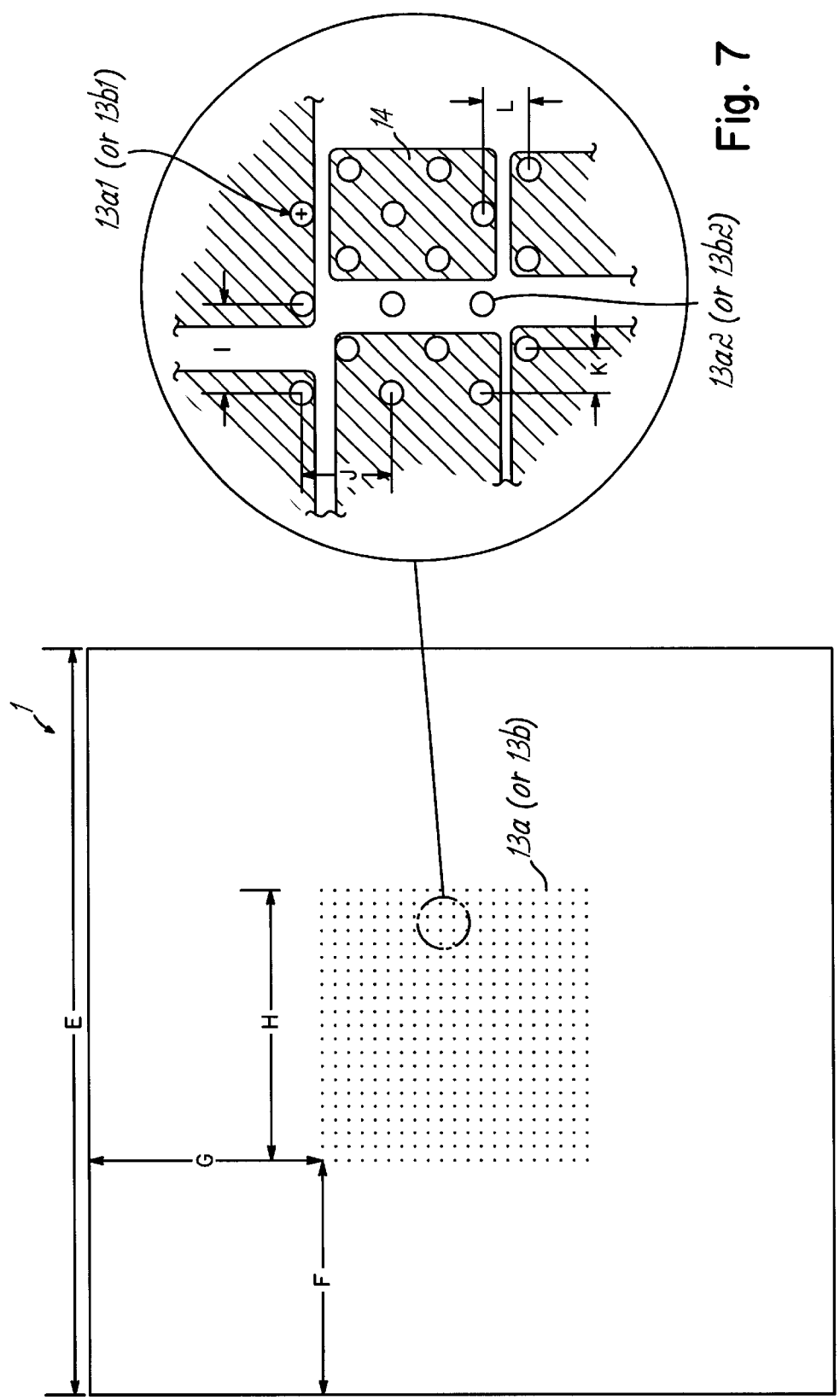

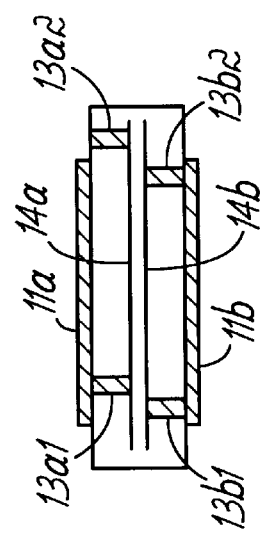
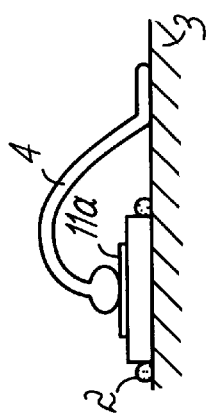
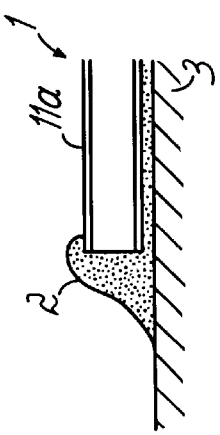
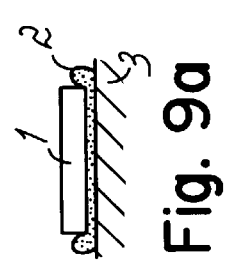
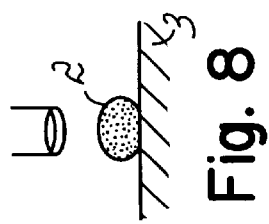

CERAMIC CHIP CAPACITOR OF CONVENTIONAL VOLUME AND EXTERNAL FORM HAVING INCREASED CAPACITANCE FROM USE OF CLOSELY-SPACED INTERIOR CONDUCTIVE PLANES RELIABLY CONNECTING TO POSITIONALLY-TOLERANT EXTERIOR PADS THROUGH MULTIPLE REDUNDANT VIAS

BACKGROUND OF THE INVENTION

1. Field of the Invention

The present invention generally concerns "parallel plate" or "single layer" capacitors as are typically made by metallizing two faces of a thin sheet of ceramic so as to make a ceramic capacitor.

The present invention further concerns high-capacity ceramic capacitors having (i) internal conductive planes connected by (ii) multiple redundant (preferably radiation patterned) vias to (iii) improved, alignment-insensitive and anti-wicking, surface pads to which electrical connection may be made.

2. Description of the Prior Art 2.1 State of the Art in Capacitor Technology Circa 1997, and Industry Impetus for Certain Improvements of All Types As reported by free-lance writer Hailey Lynne McKeefry in the article "Capacitor Technology Marches Ahead" appearing in the February, 1994, issue of Electronic Buyer's News, capacitors were then, and are now, a mature component in a mature market. Nonetheless to this maturity, U.S. manufacturers are striving mightily to improve both tantalum and ceramic capacitors. "The fact that everything you buy performs better and costs less than what you bought last year is what keeps this industry going," said Terry Weaver, president and chief operating officer at Kemet Electronics Corp., Greenville, S.C. In this sentiment the inventors of the present invention concur.

As with just about any electronic component, the motto of capacitor purchasers and manufacturers alike is "smaller is better." Capacitor manufacturers are working toward cases with smaller footprints and lower profiles. For example, the Sprague division of Vishay Electronic Components of North America and Asia developed a molded surface-mount tantalum capacitor with a rating of 6.8 microfarads in an R-size case. In September, 1997, Myrtle Beach, S.C.-based AVX Corp. announced a low-profile V-size case for its tantalum surface-mount capacitors. The TPS-V series is designed to provide capacitance/voltage (C/V) ratings higher than 3,500 and improved power dissipation. The V case measures less than 7 mm×6 mm, with a height of just 3.45 mm.

In the marketplace for ceramic capacitors (to which the present invention pertains), the 0805 case size remains popular although there is a significant move to 0603s, and even increased interest in 0402s. "Designers are leapfrogging the 0805 packages in favor of the 0603s in some designs," said Kevin Rafferty, marketing manager for ceramic capacitors at Philips Electronic Components, Jupiter, Fla. Rafferty predicts that 0805s—with a 30% share of ceramic volume—will continue to take the biggest share of the market, while 0603s will claim 20% and 0402s 5%. The remaining 35% will be divided among products in 1206 and larger packages. In 1996, 0603 packages accounted for only 5% of the market share. "The 0805s are stable, while 1206 packages are losing share," he said.

Part of what is holding the 0402s back is their diminutive size. "They are just too hard to handle," Kemet's Weaver said. "A number of our customers can't place them at all." To combat these complaints, some companies such as Murata Electronics North America Inc. are developing ways of handling the components. The manufacturer has created a small plastic case with a flip top that can hold 50,000 to 80,000 pieces. This box is slipped into a slot on the placement equipment. In comparison, a typical tape-and-reel holds about 5,000 parts. Although Murata developed the bulk cassette technology, others now offer it. For example, Kemet will ship the 0603 and 0402 sizes of its capacitors that use the X7R and C0G dielectrics in cassettes can hold 15,000 units of 0603 chips and 50,000 units of 0402 chips.

Another emerging solution is the use of capacitor arrays, in which several components are encased in a single package. The present invention will be seen to well support capacitor arrays. With these arrays OEMs are able to avoid the placement issues surrounding very small chips. In addition, they save on-board real estate and component placement costs. A standard array contains two to four chips. However, use of these packages is still limited to specialized niche markets. One of the biggest drawbacks of this packaging strategy is that all of the capacitors in the array have heretofore been required to be of same value. The present invention will be seen to readily overcome this limitation.

The fact that the Electronic Industries Association has not settled on a standard case size has also inhibited sales of arrayed capacitors. Heretofore the case size was strongly, even inflexibly, linked to the capacitance value. Therefore standardization of case sizes was, to some extent, a standardization of the capacitance values with which, for a particular packaging technology, circuit designers could work. The present invention will be seen to sever this relationship, and present a greater opportunity than heretofore of producing a ceramic capacitor of any desired value (within limits) inside a standard case, or a reduced number of standard cases.

A similar trend is occurring in the tantalum capacitor market. "We are seeing users of each case size [A, B, C, and D] going to the next-smallest case size to save real estate, while getting the same values," said Willing S. King, marketing manager for tantalum products at AVX. "In turn, we are using less material and passing that savings on to the customer." There is about a 10% price difference between case sizes, he estimated.

Computer makers primarily use C and D case sizes, while telecommunications and cellular manufacturers, the two biggest markets for tantalum capacitors, prefer the A and B sizes. A standard A case measures about 1.6 mm, while a B case is 2 mm high. Despite some similarities, the ceramic- and tantalum-capacitor businesses are, in fact, very different. In the ceramic marketplace, some of the primary focuses include advancing dielectric technologies and the advent of low-inductance products. Tantalum manufacturers, on the other hand, are concentrating on lowering equivalent-series-resistance (ESR) ratings and increasing C/V ratings.

Two popular dielectrics are the Y5V and X7R. Y5V is a general-purpose dielectric without the tighter tolerances offered by the X7R. It offers an operating temperature range of (approximately) −30 degrees C to +85 degrees C, and is favored in cost-sensitive consumer applications. The X7R, which is more temperature-stable, can handle from −55 degrees C to +125 degrees C. However, the dielectric coefficient K of the Y5V dielectric is approximately 15,000; the K of the X7R dielectric only about 4000. Accordingly, the advantage that a high-dielectric-constant dielectric offers for realizing much higher capacitance in a single chip comes at the expense of temperature stability. There has therefore heretofore been a trade-off: improved dielectric performance with resultantly increased capacitance (for the same form factor) versus enhanced temperature sensitivity. The present invention will again be seen to substantially obviate this concern, and to permit the production of ceramic capacitors of desirably high capacitance by use of only the dielectrics having lower dielectric coefficients.

OEMS have commenced to replace the tantalum chips with the ceramic parts in some instances. "Higher capacitance values and cost effectiveness make surface-mount ceramic capacitors an increasingly popular alternative to tantalum caps," said Philips' Rafferty. "Other advantages of ceramic chips include higher breakdown voltages, lower ESR, higher insulation resistance, and better pulse response for frequencies greater than 100 kHz. This means that the capacitance values can be 50% less than the equivalent tantalum caps.

Low inductance is also in demand for the PC market, particularly as faster and faster microprocessors arc designed into PCs. "There has been lots of interest in low-inductance products since the speed of processors is increasing and voltages for processors are dropping to 2.2V" Vishay's Gormally said. "Using higher-inductance parts can wreak havoc with those circuits." Vitramon has recently introduced a ceramic chip capacitor in the 0612 format with only one-third the inductance (0.3 nanohenry) of its standard counterpart.

Lowered Equivalent Series Resistance, or ESR, is also desired. Tantalum capacitors in a C-case size are available in the range from 4 V to 50 V with a maximum ESR at 25° C. of 250 milliohms to 1,600 milliohms. However, OEMs continue to push for even lower values. State of the art is around 80 milliohms to 100 milliohms. The present invention will be seen to support very low resistance electrical connection to the plates of a ceramic capacitor, thus delivering a desirably low ESR.

2.2 State of the Art in Ceramic Capacitor Technology Circa 1997

As demand for smaller, thinner, and lighter portable equipment, liquid crystal modules, and power supply modules grows, smaller and thinner ceramic capacitors are in greater demand. Since newer equipments tend to require (and provide) both higher performance and longer service life, the demand for ceramic capacitors, as opposed to tantalum or aluminum electrolytic capacitors, is greatly increasing.

To meet the demand, the industry is working, circa 1997, on increasing the capacitance, reducing the size, and improving the dielectric strength of ceramic capacitors. To manufacture a capacitor with a ceramic capacitance of 100 micro F, high technology is required to create a thin-layer dielectric substance of $5 \times 10^{-6}$ meters or less, and to, in the case of multiple electrode ceramic capacitors, form capacitors of 300 or more buried layers. To do so progress has been made in fine-graining ceramic material, particularly composite perovskite type ceramic, so that it can be thin-layered.

Recently achieved increases in capacitance have resulted in, for example, the commercialization by Murata Manufacturing Co., Ltd. (Japan) of its GRM 200 line of ceramic capacitors having up to 22 microfarads capacitance, with contemplated development of ceramic capacitors of up to 100 microfarads capacitance.

Applications of these improved, larger capacitance, ceramic capacitors include power supply modules, liquid crystal modules, and various portable equipments.

The new Murata Manufacturing Co., Ltd. GRM 200 series of large-capacitance monolithic chip ceramic capacitors include: capacitance 10 microfarads/10V of size: 3.2× 2.5×1.5 mm; capacitance 22 microfarads/10V of size: 3.2× 2.5×2.0 mm; and capacitance 10 microfarads/25V.

When small size is emphasized the sizes may be as small as 2.0×1.25×1.25 mm for the capacitance of 10 microfarads. When increased capacitance is emphasized 47 microfarads may be realized in a 3.2×2.5×1.5 mm size, 100 microfarad in a 4.5×3.2×2.5 mm size. Production of these new capacitors has reportedly been achieved by use of a thin-layer/multi-layer forming technology using improved materials.

Currently, demand for even smaller liquid crystal modules, power supply modules, and portable equipment is greatly increasing. Demand for these new capacitors is expected to expand with the need to downsize this type of equipment. Currently, the new capacitors are used mainly for smoothing in the DC-DC converters of portable equipments, noise-filtering in liquid crystal bias circuits, and smoothing/de-coupling in IC power supply lines of various equipments. The capacitors are being produced at levels from 20 to 50 million units per month as of 1996/97.

2.3 General Construction and Theory of Single-layer Parallel-plate Ceramic Capacitors Existing "parallel plate" or "single layer" "chip" capacitors are built with two parallel conductive plates separated by a single, insulating dielectric, layer that is typically made of ceramic. These single-layer parallel-plate ceramic capacitors have a very useful form factor which renders them suitable for automated assembly into microwave frequency circuits and similar applications. The normal form factor is a rectilinear parallelepiped body. Dimensions of the chip capacitors can be matched to the width of the strip lines upon which the capacitors are mounted and to which the capacitors electrically connect.

In assembly the bottom face of the chip capacitor is typically soldered or conductive epoxy attached to a conductive surface, or pad. The top face is typically ribbon, or wire, bonded to another connection point.

Most current chip capacitors are made by metallizing two faces of a thin sheet of sintered ceramic typically having a thickness in the range of 4 mils (inches) to 10 mils (inches). The metallized sheet is then cut into small rectangular bodies by sawing or by abrasive cutting techniques. The sizes of the cut bodies range from, typically, 10 mils (inches) square to 50 mils (inches) square, although some applications use rectangular forms.

While the form factor of these advices is desirable, the amount of capacitance that can be achieved and quality factor of the devices has frequently limited their usefulness. The simplified equation for the capacitance of two parallel plates is $C=kA/d$; where C is capacitance in farads, k is the dielectric constant of the insulating material between the plates, A is the area of each of the opposed plates in square meters, and d is the distance between the plates. Solution of this equation shows that a 20 mil square part (A) having a 5 mils thickness (d) in material having a relative dielectric constant of 100 gives a capacitance of 8 picofarads.

2.4 Adhesive Mounting of Single-layer Parallel-plate Ceramic Capacitors

Conductive adhesive, and particularly conductive epoxy adhesive, may be used to strongly permanently bond single-layer parallel-plate ceramic capacitors to a substrate. The capacitors are simultaneously (i) adhesively attached, and (ii) electrically connected, to a substrate circuit by first being placed in a puddle of liquid conductive epoxy, which epoxy is then cured. It is intended that the conductive epoxy contact only the underside conductive surface of the capacitor; electrical connection to the topside conductive surface being made by ribbon, or wire, bonding.

Sometimes, however, the liquid epoxy will wick up the sides of the capacitor, especially if these sides are (i) other than exactly perpendicular to the substrate, and/or (ii) too much epoxy is used. The conductive epoxy wicked up the sides of a single-layer parallel-plate ceramic capacitors may flow over onto, and electrically contact, the conductive topside surface of the capacitor, resulting in reduced resistance or even a total shorting of the capacitor.

Some manufacturers have previously gone to extraordinary lengths to angle the edges of their capacitors in order to avoid this problem. Generally, however, features that extend the body of the capacitor, and that thereby serve to isolate one or both of the conductive areas (plates) of its underside and topside surfaces, only serve to reduce the area of the plates for a given physical size, and thus adversely reduce the capacitance of a capacitor of any given size.

2.5 Creation of Vias in Ceramic Capacitors and Other Ceramic Electrical Components The present invention will be seen to concern improvements in the creation of vias, or through holes—though which vias electrical connection can be made by the deposition of metal—in the ceramic electrical components having ceramic-covered or ceramic-encapsulated electrically-connectable parts. The improvements are applicable to ceramic capacitors containing electrically conductive plates, but are not limited to ceramic capacitors, being also useful in fabrication of piezoelectric sensors and actuators, for example.

The conventional means of making vias is discussed in U.S. Pat. No. 4,864,465 for a VIAD CHIP CAPACITOR AND METHOD FOR MAKING SAME to William L. Robbins. The Robbins patent concerns a two pole viad chip capacitor activatable from either of its sides. The capacitor has (i) a plurality of ceramic layers in a stack, each and every layer having only two vias, a first via in a first region of each layer and a second via in a second region of each layer; (ii) a first conductor in each of the first vias; (iii) a second conductor in each of the second vias; (iv) a stack of first capacitor plates being on first alternate ceramic layers and each first plate being in electrical contact with a first conductor; (v) and a stack of second capacitor plates, the second plates being on second alternate ceramic layers that are interdigitated with the first alternate ceramic layers and in electrical contact with a second conductor.

The Robbins capacitor is a conventional-type ceramic chip capacitor solderable at both ends for use on printed circuit boards. The ceramic conventional volume and external form of the ceramic chip capacitor of the present invention will be seen, however, to be of a different nature. Namely, the (nominal) "top" and "bottom" of the capacitor have extensive conductive planes, or pads. This permits the new capacitor of the present invention to be machine located and soldered (typically) immediately adjacent integrated circuits in small packages—substantially unlike the Robbins capacitor.

The vias of the Robbins capacitor, and of other ceramic capacitors, may be mechanically punched in the green ceramic sheets, or may be punched through the ceramic sheets by hydraulic jets, before sintering of the multi-layer ceramic capacitor. The punching technique, in particular, continues to work well for the creation of vias in the ceramic capacitors of the present invention and is, indeed, used at a much higher density than heretofore in order to create a greatly increased number of vias per unit area, and overall, than heretofore.

However, fabrication of the improved capacitors of the present invention will also be seen to usefully employ a method of creating vias, or through-holes, in the ceramic of electrical components having ceramic-covered or ceramic-encapsulated electrically-connectable parts by use of one or more photosensitive ceramic binders. A number of issued United States patents concern ceramic compositions having photosensitive binders, an exemplary five of which patents are assigned to E. I. Du Pont de Nemours and Company (Wilmington, Del.).

U.S. Pat. No. 4,613,560 to Dueber, et. al. for a PHOTOSENSITIVE CERAMIC COATING COMPOSITION assigned to E. I. Du Pont de Nemours and Company (Wilmington, DE) concerns a photosensitive ceramic coating composition which is fired in a substantially non-oxidizing atmosphere comprising an admixture of: (a) finely divided particles of ceramic solids having a particularly defined surface area-to-weight ratio and particle size, and (b) finely divided particles of an inorganic binder having a particularly defined surface area-to-weight ratio and particle size, dispersed in an organic medium comprising (c) an organic polymeric binder and (d) a photoinitiation system, dissolved in (e) photohardenable monomer and (f) an volatile organic solvent.

U.S. Pat. No. 4,912,019 to Nebe, et al. for a PHOTOSENSITIVE AQUEOUS DEVELOPABLE CERAMIC COATING COMPOSITION assigned to E. I. Du Pont de Nemours and Company (Wilmington, Del.) concerns a photosensitive ceramic coating composition which is fired in a substantially non-oxidizing atmosphere comprising an admixture of: (a) finely divided particles of ceramic solids having a surface area-to-weight ratio of no more than 10 $m^2/g$ and at least 80 weight percent of the particles having a size of 1–10 $\mu$m, and (b) finely divided particles of an inorganic binder having a glass transition temperature in the range from of 550° to 825° C., a surface area-to-weight ratio of no more than 10 $m^2/g$ and at least 90 weight percent of the particles having a size of 1–10 $\mu$m, the weight ratio of (b) to (a) being in a range from 0.6 to 2, dispersed in an organic medium comprising (c) an organic polymeric binder, and (d) a photoinitiation system, dissolved in (e) photohardenable monomer, and (f) an organic medium. An improvement to this composition comprises an organic polymeric binder containing a copolymer or interpolymer of a $C_1$–$C_{10}$ alkyl acrylate, $C_1$–$C_{10}$ methacrylate, styrene, substituted styrene or combinations thereof and an ethylenically unsaturated carboxylic acid, wherein a moiety in the binder derived from the unsaturated carboxylic acid comprises at least 15 weight percent of the polymer and wherein the binder has a molecular weight not greater than 50,000 and wherein the composition upon imagewise exposure to actinic radiation is developable in an aqueous solution containing 1 percent by weight sodium carbonate.

Similarly, U.S. Pat. No. 4,959,295 is for a PROCESS OF MAKING A PHOTOSENSITIVE SEMI-AQUEOUS DEVELOPABLE CERAMIC COATING COMPOSITION; U.S. Pat. No. 4,925,771 is for a PROCESS OF MAKING PHOTOSENSITIVE AQUEOUS DEVELOPABLE CERAMIC COATING COMPOSITION INCLUDING FREEZE DRYING THE CERAMIC SOLID PARTICLES; and U.S. Pat. No. 4,908,296 is for a PHOTOSENSITIVE SEMI-AQUEOUS DEVELOPABLE CERAMIC COATING COMPOSITION.

SUMMARY OF THE INVENTION

The present invention contemplates a ceramic capacitor of conventional volume and external form—meaning a parallelepiped body having exterior pads to which electrical connection is made—that is enhanced in its capacitance by dint of including at least one interior metallization plane, and preferably one or more pairs of interior metallization planes, that are parallel to capacitor surfaces where exist pads and/or traces. Electrical connection between these interior metallization planes and the surface pads and/or traces (which pads and traces need not be, and which commonly are not, coextensive with the planes) is made though (i) abundant (ii) redundant vias.

In accordance with the physical law that capacitance between two conducting planes is inversely proportional to the distance of 10 separation, the capacitance between these interior metallization planes—which capacitance is seen at the exterior of the capacitor when these internal planes are electrically connected to the exterior pads—is greater than that capacitance which would alternatively be seen between opposed exterior pads (which have heretofore served as the electrodes) should no electrically-connected interior metallization plane(s) be present.

The present invention further contemplates that each interior metallization plane within a ceramic capacitor so constructed should be redundantly, and preferably massively redundantly, electrically connected to associated exterior pads by plural, and more preferably by multiple, vias. By this construction the enhanced-capacitance ceramic capacitor may be reliably conventionally fabricated in huge arrays (typically many thousands of capacitors) on workpiece "bars" regardless that any single one via, and some few vias, may not be properly located. Additionally, the redundant vias make a low-resistance electrical connection useful at high frequencies.

Moreover, the many vias are preferably located in a dense uniform pattern; normally a regular pin grid array. Because both (i) the interior metallization planes internal to the capacitor, and the (ii) exterior metallizations in the forms of traces and pads, do not commonly occupy all the area of the capacitor, this makes that many vias "lead to nowhere", connecting to metallization at only one end (a "missed via") or at neither end (an "empty via"). These "missed" and/or "empty" vias are intentional: they permit fabrication of diverse capacitors (i) by uniform processes in which (ii) alignment is not critical. In the course of capacitor fabrication, those vias that actually connect to metallization (which is typically more than 50%, but less than 100% of all vias) fill with metal. Those vias that do not serve to connect to metallization areas tend to close off, and heal, during annealing of the capacitor ceramic. The small regions where these "vestigial" "empty" vias are present do not significantly affect capacitor performance.

The present invention still further contemplates a ceramic capacitor having amply numerous, and amply-large exterior pads so as to easily readily support positionally-tolerant electrical connection. In particular, the exterior pads, of which there may commonly be but two located on opposed sides of the ceramic capacitor, are much, much larger than are the egress areas of (preferably multiple) vias that connect to interior metallization planes that are within the capacitor. The exterior pads are, indeed, so large as to span between multiple vias. Equivalently, it may be said that multiple vias connect each interior metallization plane to an associated external surface pad, and that the vias are thus "redundant".

The present invention still further contemplates that all the collective large-area exterior pads (or pad) on at least one, and preferably both, surfaces of the capacitor should be withdrawn from the edges of the capacitor. It is thereby beneficially promoted that (insulating) epoxy adhesive will not wick onto the conductive pads of the capacitor, potentially interfering with electrical connection to these pads, during adhesive surface mounting of the capacitor.

Still other niceties are present in the improved capacitors, particularly including (i) parallelepiped ceramic bodies that are (by dint of the close interior metallization planes) of sufficient size and thickness so as to substantially avoid fracture during routine handling (regardless that the capacitance is much higher than even that which would normally be realized from a ceramic capacitor so excessively thin so as to typically be undesirably fragile), and (ii) rounded edges.

Finally, the present invention contemplates improved methods of realizing the abundant multiple vias; namely, the vias are either (i) stamped as a grid array in the green ceramic sheets (from which the ceramic capacitor is made), or else (ii) patterned with radiation, normally ultraviolet light, in a ceramic dielectric tape having a photosensitive binder. In the case of method (ii), unexposed areas of the tape are cost effectively washed out with solvent, instead of being punched out, before sintering of the ceramic so as to easily and accurately create multitudinous holes.

Howsoever abundantly perforated, the perforated ceramic tape is used to make wafers of arrayed ceramic capacitors the future vias are accurately precisely positionally located. Notably the ample, and amply-large pads, that are, as previously explained, positionally-tolerant of later external electrical connection are to some extent made possible by the precise location of the many vias. Namely, the vias typically serve to define the boundaries of the pads, and the precise location of these vias permits the pads, even as they are preferably withdrawn from the edges of the capacitor, to advantageously occupy all available surface area, and to partition this area optimally.

Quite simply, the interior structures and geometries of the ceramic capacitor (the potentially many metallization planes, and the many permissible geometries of these metallization planes) are divorced from the exterior structures and geometries of the same ceramic capacitor (the potentially many pads and vias, and the many permissible geometries of these pads and vias), and vice-versa. Each region is substantially optimized for its function without making such compromises to the function of the other region as have heretofore been made. For devices that are made in quantities of hundreds of millions of units, these improvements are worth making.

Accordingly, the present invention offers the following advantages.

The usefulness and/or capacitance of ceramic capacitors of conventional external shapes and forms is extended either by (i) producing a higher capacitance for a given dielectric formulation, (ii) producing the same capacitance with a dielectric formulation that is either less expensive and/or less temperature sensitive, and/or (iii) producing the same capacitance with the same dielectric formulation in a geometrically smaller volume.

A conventional single-layer ceramic capacitor has a thickness of 5 mils or greater whereas the thickness of the active layer of the capacitors of the present invention is typically only 0.5 mils or less. This accords a ten times (×10) improvement in capacitance.

This improvement in capacitance can be "traded off" to produce a capacitor of equal size with improved temperature stability. For example, a conventional 5 volt ceramic capacitor with an 85° C. maximum temperature rating could be replaced with the X7R dielectric material, according a maximum temperature rating of 125° C., while maintaining equal capacitance by use of the present invention.

Meanwhile, user yields are improved. Namely, the area(s) and/or the location(s) of surface pads and/or traces are optimized—especially as such may be withdrawn slightly from the edges of the capacitor to alleviate shorts during adhesive mounting—so as to improve user yields in mounting and connecting the capacitors without sacrificing either (i) capacitance nor (ii) small size.

Meanwhile, ESR is excellent. The preferred abundant, and redundant, vias connecting the ample, reliably-connected, surface pads to the internal metallization planes ensure a low Equivalent Series Resistance (ESR), and thus good high-frequency performance.

Meanwhile, reliability is high. The new capacitors are a true monolithic structure, with the potentially delicate electrodes buried within the three-dimensional body of the capacitor while the surface pads and traces are typically made robust, and resistant to all temperatures and atmospheres to which the capacitor may be exposed. The surface material is, in particular, unlikely to delaminate, nor to corrode.

The capacitors of the present invention are truly monolithic devices, being co-fired in all layers at the same time. It is known in the ceramic business that the atmospheric sintered surface of a ceramic piece is different than the interior of the ceramic. In particular, the oxidation potential is different at the surface than in the interior. The surface typically comes into contact with a dissimilar ceramic during processing. Zirconia oxide carriers such as those supplied by Applied Ceramic of Georgia are commonly used as sintering aids. Considerable pre-processing or "seating" of the ceramic bodies is often done to reduce the diffusion of these zirconia sintering aids into the capacitor and into the capacitor dielectric compounds during high temperature processing.

In the traditional, single-layer, ceramic capacitors, the metallized surface conduction areas typically use glass frits as the adhesion mechanism to adhere the metal to the ceramic. The resulting system typically has a glass-rich zone at the ceramic surface.

Both the (i) zirconia and the (ii) glass are adverse to the creation of uniform, quality, capacitor electrodes. (Where the (i) zirconia and/or the (ii) glass is present, there the metal is not.) By putting the capacitance forming elements into the interior of the ceramic capacitor, the present invention completely avoids the issue of surface anomalies.

The present invention mandates vias. Thus it is somewhat disingenuous to claim that vias are an advantage of the invention. It might better be said that the concept of abundant redundant vias is, as expressed for capacitors in the preferred embodiment of the present invention, applicable to other devices, including piezoelectric sensors. The redundant via holes all but eliminate the requirement for precise alignment between layers in the built-up ceramic capacitor. Because connection is assured by some of the redundant vias regardless of mis-alignment(s) and/or mis-registration(s) of layers, manufacturing efficiency is enhanced. The optimum via hole size, and spacing, can even be chosen mathematically and geometrically to, given the location(s) and size(s) of each internal metallization plane(s), best and most reliably connect this plane (these planes) to one or more surface pads and/or traces. Usually this "best and most reliable" optimization is trivial; the preferred vias are preferably 2 mils in diameter on 10 mil centers in square "pin grid" arrays over the entire planar area of the ceramic capacitor, howsoever large. In other words, a regular grid array of some hundreds or thousands of vias is typically punched, hydraulically drilled, laser drilled, or photochemically patterned and removed in selected ceramic layers of even the smallest capacitors. These small vias at this small spacing makes that at least 4–5 vias are redundant for even the smallest interior or surface connection areas (i.e., planes or pads) as of yet employed.

In summary, the new and improved ceramic capacitor has enhanced capacitance. It electrically connects reliably and well, with but small Equivalent Series Resistance (ESR). It adhesively connects reliably without causing undesired interference with the electrical connection. It is rugged, and resists breakage or chipping during normal handling, including by machine. It may be sophisticated, containing several smaller capacitors, which may be of differing values, in a single, monolithic, package. Nonetheless to a sophisticated internal structure, the surface pads and/or traces to which electrical connection(s) is (are) made may be amply sized and well-situated. The new capacitor is, of course, completely compatible with existing machines, circuits and processes.

These and other aspects and attributes of the present invention will become increasingly clear upon reference to the following drawings and accompanying specification.

1. A Ceramic Capacitor of Conventional Form
(With Electrical Connection Through Opposed
Exterior Pads) Also Having and Connecting
Internal Metallization Planes In accordance with one of its aspects, the present invention may be considered to be embodied in a capacitor having a ceramic body (of a finite thickness) and at least one area of metallization to which electrical connections may be made on a portion of each of two opposite exterior substantially co-planar surfaces of the ceramic body. In other words there are at least two, and most commonly exactly two, opposed metallization areas, or pads, or simply "exterior metallizations". (So far, this is the most common form of ceramic capacitor in the world.)

At least one, and most typically two, metallization planes are both interior to the body and substantially co-planar to the exterior metallizations. Each of these planes is thus more closely situated to each exterior metallization than the exterior metallizations are to each other.

At least one via, and most commonly a great number of vias, electrically connects, and most commonly redundantly electrically connects, each one of the (typically two) exterior metallizations to an associated (i.e., closest) interior metallization plane. This connection is to the end that, because capacitance between two conducting planes is by physical law inversely proportional to the distance of separation, the capacitance between at least one pair of exterior metallizations on opposite surfaces will be greater than that capacitance which would alternatively exist should no electrically-connected interior metallization plane be present.

The collective area or areas of the exterior metallization upon at least one surface, and preferably both opposed surfaces, of the ceramic body is preferably not substantially co-extensive with, and is less than, the entire surface area of a face of the ceramic capacitor. Instead, this collective area is instead preferably somewhat smaller than is the surface area of the face, and is in particular withdrawn from the edges of the face. By this construction the associated interior metallization plane(s) is (are) larger than are the collective exterior metallization areas. More importantly, the reduced-area exterior metallizations are slightly withdrawn from the edges and sides of the ceramic body. By this construction the undesirable wicking of insulating adhesive, normally epoxy adhesive, onto the metallization areas (thus undesirably interfering with electrical connection) is avoided during adhesive surface mounting of the capacitors.

As previously explained, the finite thickness of the ceramic body is normally sufficient so as to permit routine handling of the ceramic capacitor without breakage. This increased thickness is now without penalty to the capacitance.

Furthermore, at least one edge of one surface, and preferably all edges of all surfaces, are rounded so as to reduce the propensity of these edges to chip. These rounded edges, which heretofore reduced the metallization area and the net capacitance, are again now realized without penalty to the capacitance.

2. A Ceramic Capacitor of Conventional Form With (i) Redundant Electrical Connections Through Multiple Vias to Internal Metallization Planes and (ii) Ample Large Pads Much Larger Than are the Egress Areas of Any One Via In accordance with another of its aspects, the present invention may be considered to be embodied in a capacitor having a ceramic body (of a finite thickness) and ample large exterior metallization areas, or pads, on each of opposed surfaces to the body (to which pads electrical connections may easily be made).

Notably, a plurality of metallization planes—normally two such metallization planes—are located interior to the body and co-planar to the exterior metallization areas.

A number of vias electrically connect each one of the interior metallization planes each to associated one of the exterior pads. This connection is redundant; each pad is electrically connected to its associated interior metallization plane by multiple vias. Each (connected) pad is much larger than the egress area of any one via. Finally, and in accordance with the physical law that capacitance between two conducting planes is inversely proportional to the distance of separation, the capacitance between at opposed pairs of exterior pads on opposite surfaces is greater than that capacitance which would alternatively exist should no electrically-connected interior metallization plane be present.

In total, this construction makes that the ceramic capacitor is simultaneously of (i) enhanced capacitance due to its interior metallization planes while it (ii) supports reliable electrical connection to, ultimately, these interior metallization planes. It does so support this reliable electrical connection both because (i) the vias are redundant, and (ii) the pads are larger than are the egress areas of the vias, and are thus positionally tolerant of electrical connection (to other circuitry exterior to the capacitor).

3. A Ceramic Capacitor, or Other Ceramic Electrical Component, With Multiple Redundant Radiation-Patterned Vias Between Interior Conductive Regions and Each of Potentially Several Electrically Conductive External Pads In accordance with yet another of its aspects, the present invention may be considered to be embodied in a method of manufacturing a ceramic capacitor having vias overlying an electrically conductive structure to which electrical connection may be made through the vias.

The method includes placing upon at least one surface of a parallelepiped ceramic body having a finite thickness a first metallization plane. An electrically-insulating ceramic sheet or tape, suitable in a portion thereof to form a layer of a laminate electrical component, having a photosensitive binder is applied over this first metallization plane.

The photosensitive-binder ceramic sheet or tape is patterned with a multiplicity of dots at regions where are desired vias by act of exposing the ceramic sheet or tape to radiation to which the photosensitive binder is sensitive through a pattern mask. Ceramic dielectric at the regions of the patterned dots where the photosensitive binder is ineffective to cohere the ceramic is then washed out with solvent, producing thereby a ceramic sheet or tape layer with holes atop a first metallization plane.

The entire laminate structure of (i) the holed ceramic sheet or tape layer upon (ii) the first metallization plane upon the (iii) parallelepiped ceramic body is then fired so as to create a monolithic sintered body. A second metallization plane is patterned into at least one electrically conductive pad upon the sintered body, and into the holes of the sintered holed ceramic sheet or tape layer, so as to create Vias in the holes. Notably, at least two of these vias electrically redundantly connect the first metallization plane to the at least one electrically conductive pad of the second metallization plane.

When considered to be embodied in a electrical component, this aspect of the invention may be recognized to be expressed as an electrically conductive region under a ceramic layer to which region electrical connection is redundantly made to electrically conductive pad regions on the top of the ceramic layer by plural vias for each said pad region, the vias being formed in the overlying ceramic layer which had in its green state a photosensitive binder by patterning this green state ceramic layer with radiation, washing away unexposed ceramic with solvent so as to form patterned holes, and sintering the ceramic and the electrically conductive region and the electrically conductive pad regions so that the holes became filled with metal and become vias.

BRIEF DESCRIPTION OF THE DRAWINGS

FIG. 1, consisting of FIG. 1a through FIG. 1i, is diagrammatic view of one possible "family tree" of capacitors in accordance with the present invention generally characterized in that electrical connections are made on both top and on bottom surfaces of the capacitor.

FIG. 6 is another top plan view of an entire sheet of via'd tape used in making -a preferred embodiment of a ceramic chip capacitor in accordance with the present invention, the tape particularly showing the many small vias.

FIG. 7 is an exploded view of a portion of the via'd tape previously seen in FIG. 6.

FIG. 8 is a diagrammatic view of the application of a drop of epoxy adhesive to a substrate to which a ceramic chip capacitor will subsequently be mounted.

FIG. 9, consisting of FIGS. 9a through 9c, are diagrammatic views of an undesirable "creep" of the epoxy adhesive onto the electrically conductive upper surface pad of any ceramic chip capacitor, including one having buried plates in accordance with the present invention, where the pad occupies the entire upper surface of the capacitor; and a preferred embodiment of a ceramic chip capacitor in accordance with the present invention where the conductive upper surface pad is withdrawn from the edges, helping to preclude that any excess epoxy adhesive extending onto the upper surface of the capacitor should later interfere with electrical connection.

FIG. 10 is diagrammatic view showing the manner of electrical connection to an upper surface pad of a preferred embodiment of a ceramic chip capacitor in accordance with the present invention.

FIG. 11 is a diagrammatic view illustrating the "alignment fault tolerance" of the preferred multiple redundant vias.

DESCRIPTION OF THE PREFERRED EMBODIMENT

Figure 2A:
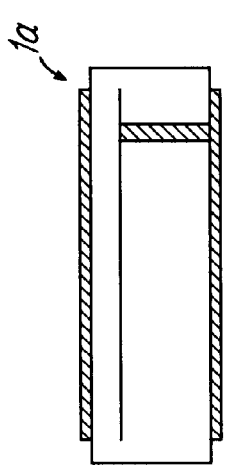
FIG. 2, consisting of FIG. 2a through FIG. 2c, is diagrammatic view of another possible "family tree" of capacitors in accordance with the present invention generally characterized in that electrical connections are made on only one surface of the capacitor.

The present invention contemplates a ceramic chip capacitor of the "parallel plate" or "single layer" type having conventional volume and external form which, nonetheless to its conventional appearance (and use), exhibits increased capacitance from use of closely-spaced interior conductive planes. Moreover these internal conductive planes, preferably two or more in number, are reliably connected to positionally-tolerant exterior pads through multiple redundant vias.

The "parallel plate" or "single layer" ceramic capacitor has a very useful form factor for assembly into microwave frequency and similar electrical circuits. These circuits may be laid out on printed circuit (pc) boards, or be present on IC's within chip carriers and other packages where space is typically even more precious. The dimensions of the ceramic capacitor can be matched to the width of a strip line on the pc board or the chip carrier holding an IC.

In assembly the bottom face of the ceramic chip capacitor is typically soldered or conductive epoxy attached to a conductive surface upon the pc board substrate. The top face of the ceramic capacitor normally presents one or more electrically conductive pads that are typically ribbon- or wire-bonded to another circuit connection point.

Most ceramic chip capacitors currently offered (circa 1997) are made by metallizing two faces of a thin sheet of sintered ceramic that is typically in the range of 4 mils (inches) to 10 mils (inches) thick. The metallized ceramic sheet is then cut to size by sawing or abrasive cutting techniques. Typical sizes of the chip capacitors range from 10 mils (inches) square to 50 mils (inches) square, although some applications use rectangular forms.

While the form factor of these simple devices—used in quantities of hundreds of millions per year—is highly desirable, the amount of capacitance that can be achieved and quality of the devices realizing maximum capacitance is starting to limit their usefulness in certain applications. The simplified equation for the capacitance of a parallel plate capacitor, c=KA/d where K is the dielectric constant, A the area of each of opposed plates, and d the distance of separation between plates, shows that a 20 mil square part (A) of 5 mil is thickness (d) made from ceramic with a relative dielectric constant of 100 yields a capacitance of 8 picofarads.

This five mils thickness—necessitated in order to establish some structural strength for the given area size of, for example, 20 mils×20 mils—makes that the capacitor does not have much structural strength, and is subject to undesirable fracturing or chipping during routine handling and assembly into circuits. Thus the physical resistance to damage of the highest-capacitance "parallel plate" or "single layer" ceramic capacitors is innately poor. The design of single-layer capacitors in general is a compromise between the use of thicker ceramic layers for greater strength and thinner ceramic layers for greater capacitance.

A diagrammatic view of one possible "family tree" of capacitors in accordance with the present invention is shown in FIG. 1, consisting of FIG. 1a through FIG. 1i. The capacitors 1a–1h are generally characterized in that electrical connections are made on both top and on bottom surfaces of the capacitor.

Capacitor 1a shown in FIG. 1a may be considered rudimentary, consisting of one interior metallization plane 1a1 that is connected to a one of the external pads 1a2, 1a3 (pad 1a3 is shown connected) through a preferably plural number of vias 1a4. The preferably several vias may be considered to be "lined up" into the depth of the drawing although, as will be seen, the several redundant vias are occasionally explicitly illustrated such as in, inter alia, FIGS. 1h and 1i.

A more typical capacitor is capacitor 1b shown in FIG. 1b. Herein two interior metallization planes 1b10 and 1b11 are respectively connected to external pads 1b2, 1b3 through the preferably plural vias 1b40, 1b41. Again the preferably several vias may be considered to be "lined up" into the depth of the drawing.

The two interior metallization planes need not be most closely adjacent the external pads to which they connect, as is shown by internal metallization planes 1c10 and 1c11 respectively connecting to external pads 1c2 and 1c3 in the capacitor 1c of FIG. 1c.

Plural interior metallization planes may be present, as illustrated in the capacitor 1d of FIG. 1d. Although the vias of the capacitors 1c and 1d are redundant (many such existing in line into the depth of the drawing), these embodiments require better alignment during fabrication, at least in one direction, than is generally typical for embodiments of the invention, as will be later explained. Consequently, the higher capacitance of the embodiments 1c and id comes at the cost of greater precision in fabrication.

A preferred implementation of the invention as a capacitor 1e having multiple vias in each of two, as opposed to one, axes is illustrated in FIG. 1e.

Multiple capacitors 1f–1i are respectively illustrated in FIGS. 1f–1i. A "series capacitor" if shown in FIG. 1f has a passive internal metallization layer 1f11, not directly connected, that serves to buffer electrostatic communication between internal metallizations 1f10 and 1f12, which are externally electrically connected.

True "multiple capacitors" such as capacitors 1g though 1i are more common. In capacitors 1g and 1h one internal metallization, or plate, of the plural capacitors within a single monolithic body is shared by all such capacitors. Capacitor 1h as compared to capacitor 1g simply illustrates, as did capacitor 1e relative to capacitor 1b, that the vias may be, and preferably are, redundant in each of two directions. The multiple capacitor 1i shown in FIG. 1i contains many separate capacitors, some of which share one electrode in common and some of which share no electrodes.

Figure 2B:
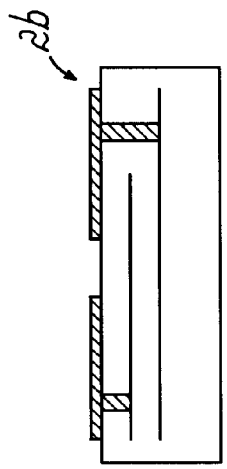
Figure 2C:
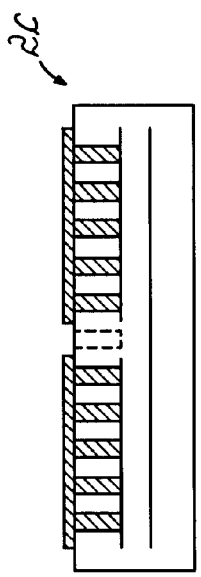

A diagrammatic view of another possible "family tree" of capacitors in accordance with the present invention is shown in FIG. 2, consisting of FIG. 2a through FIG. 2c. The capacitor 1a is now evolved into capacitors 2b and 2c which are generally characterized in that electrical connections are made on only one surface of the capacitor.

Figure 3A:
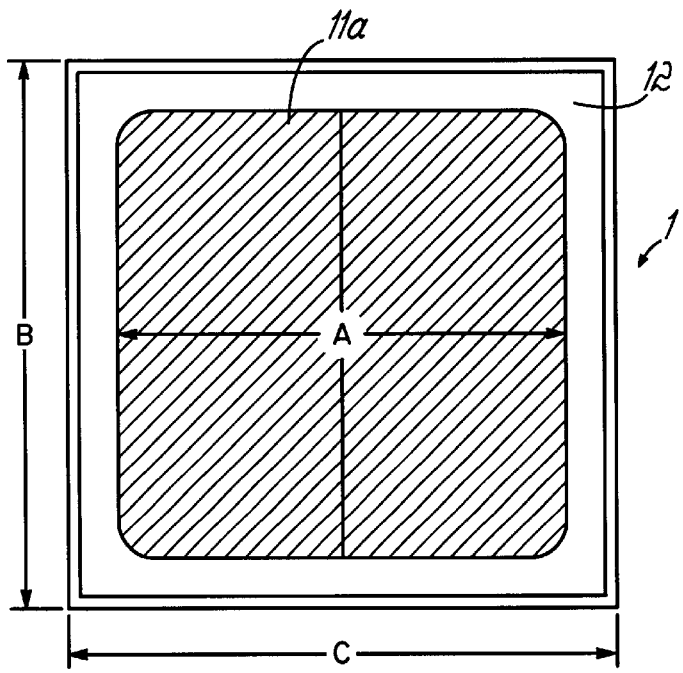
FIG. 3, consisting of FIG. 3a through FIG. 3c, respectively show a top plan view, a side plan view, and an x-ray top plan view of a preferred embodiment of a ceramic chip capacitor in accordance with the present invention.
Figure 3B:
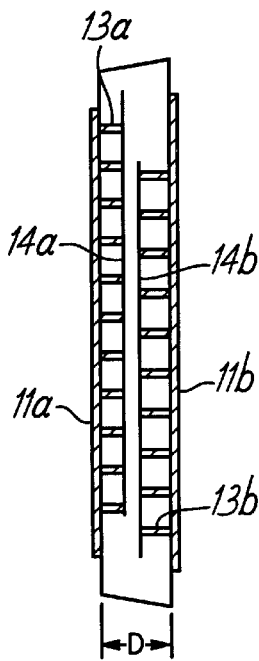
Figure 3C:
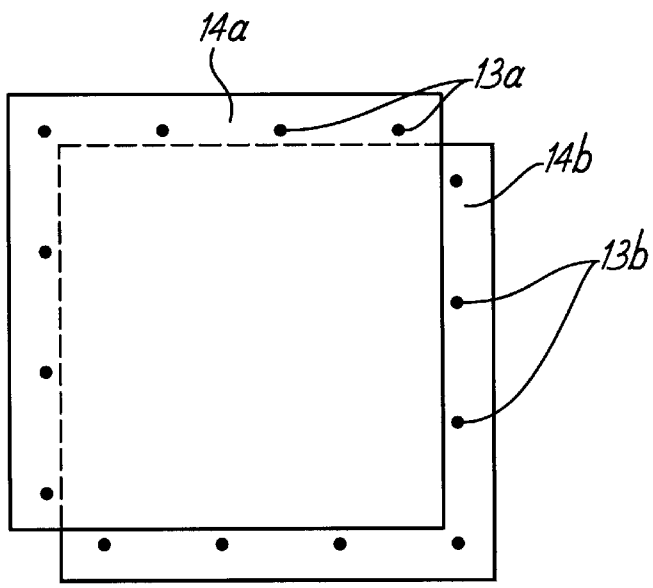

A preferred embodiment of a ceramic chip capacitor 1 in accordance with the present invention in its simplest form is illustrated in FIGS. 3a through 3c: a top view being shown in FIG. 3a, a cut-away side view in FIG. 3b, and another, x-ray, top plan view in FIG. 3c. The top metallization, or (in this case) single, pad 11a is preferably surrounded by a margin 12 of the underlying ceramic. A typically identical pad 11b (best seen in FIG. 3b) exists on the underside of the capacitor 1, which is top-bottom reversible in use.

Dimensions B and C of the ceramic capacitor 1 are typically 0.025 inches (25 mils) whereas the dimension A of the metallization 11 is typically 0.0195 inches (19.5 mils). The thickness dimension D shown in FIG. 3b is typically 0.005 inches (5 mils). Almost any reasonable overall size, and square or rectangular or other shape, is possible, with sizes in the range larger than 15 mils square being most common.

FIGS. 3c and 3b particularly show an exemplary pattern of multiple vias groups 13a and 13b respectively electrically connecting to each of two, offset, electrically conductive internal planes 14a and 14b. The internal planes 14a, 14b are obviously closer together then the external metallizations, or pads 11a, 11b to which they respectively redundantly electrically connect through respective redundant vias groups 13a, 13b. This close proximity raises the capacitance. At a plate-to-plate spacing of, typically, 0.5 mils as compared to a spacing of 4 mails between the electrodes 11a and 11b, the resulting capacitance is ten times (×10) higher. In multiple plate capacitors this advantages can be increased.

Figure 4:
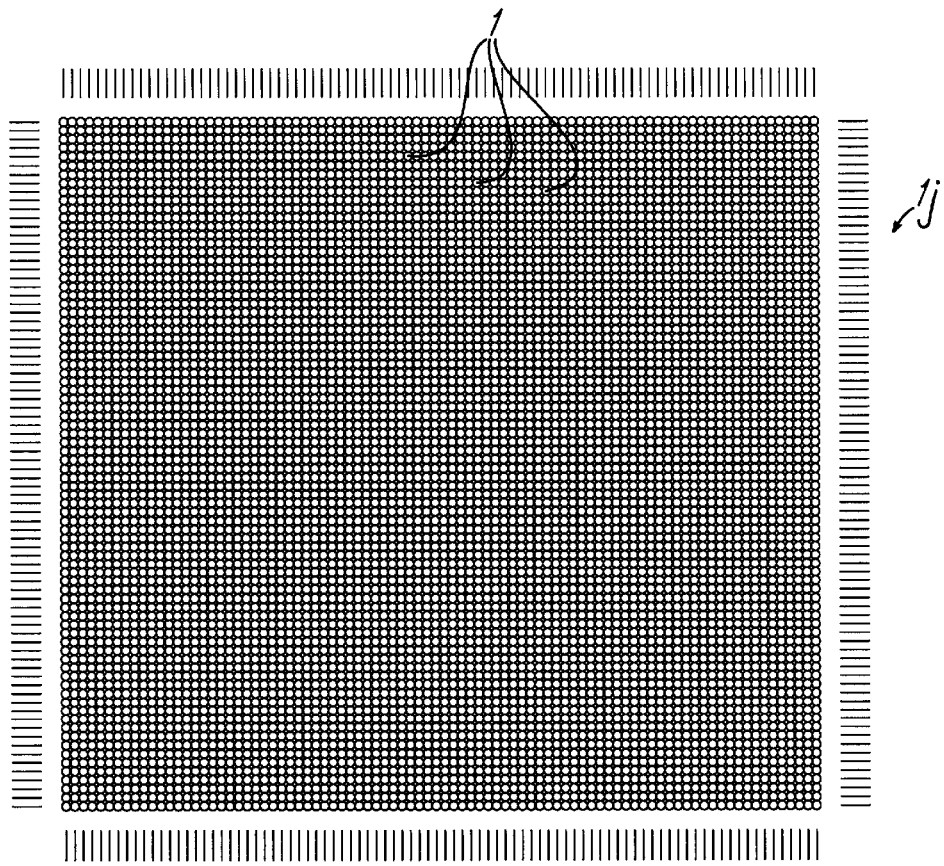
FIG. 4 is a top plan view of an entire un-diced wafer of ceramic chip capacitors in accordance with the present invention in order that the small size thereof may be illustrated.

A top plan view of an entire un-diced wafer of ceramic chip capacitors in accordance with the present invention is shown at roughly actual scale in FIG. 4. The small size of the capacitors within the arrayed capacitors 1j may be appreciated.

Figure 5:
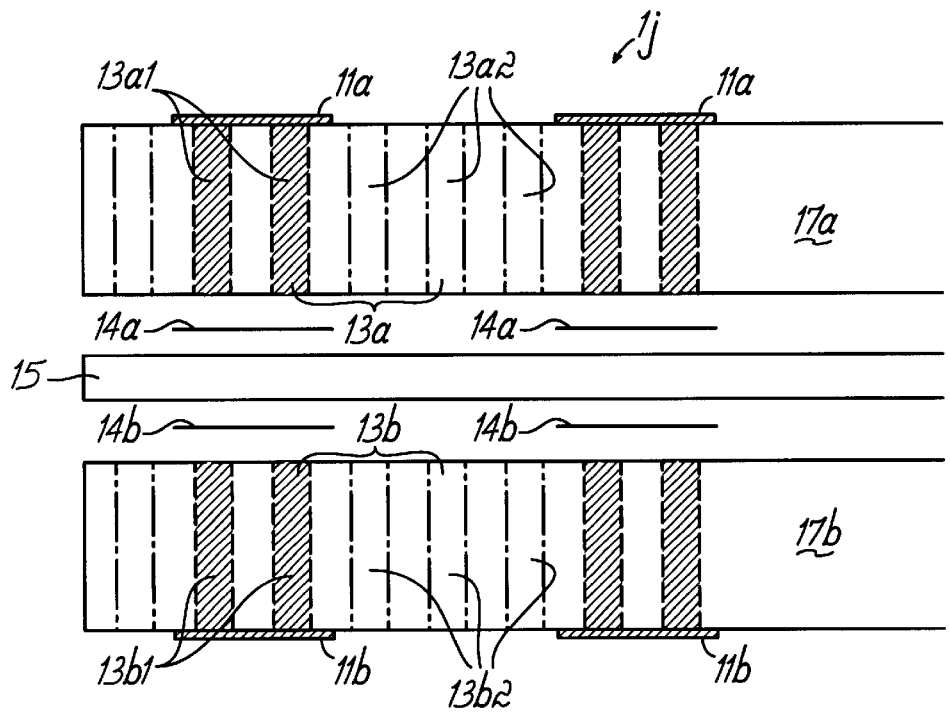
FIG. 5 is an exploded diagrammatic side view of a preferred embodiment of a ceramic chip capacitor in accordance with the present invention.

The manner of the construction of the arrayed capacitors 1j is illustrated in the exploded diagrammatic side view of FIG. 5. A center ceramic dielectric layer 15 is faced on either side with patterned metal electrodes, or plates 14a, 14b. The three-layer laminate is overlaid on both sides with a respective ceramic sheet, or tape, 17a, 17b in which are respectively present the arrayed vias 13a, 13b. Finally, patterned metallization areas, or simply metallizations", or pads, 11a, 11b are placed upon the respective ceramic tapes 17a, 17b. The entire multi-layer laminate is fused together and sintered into the monolithic body of the arrayed capacitors 1j.

Note that the vias 13a1, 13b1 which are shown in dashed line of normal thickness become filled with metal. There are a great many other vias 13a2, 13b2—shown in phantom line—which are present but through which no electrical connection is made. This is one of the simplicities, and strengths, of the present invention. The vias arc typically patterned as a large, closely spaced, regular "pin grid array" over the entire area of the ceramic as will prospectively be used to produce functional (ceramic capacitor) components. No special care needs be taken to use a custom via pattern for different devices, nor even to carefully (i) align and/or (ii) register the standard via pattern on the ceramic sheet. (The tolerance of the capacitors of the present invention to misalignment between their layers will be further explained in conjunction with FIG. 11.)

The vias may be created by diverse methods. They may be mechanically punched out. This simplest of methods works very well, and is thus preferred until the vias become much smaller than 2 mils in diameter. The vias may be mechanically drilled. The vias may be laser drilled.

Finally, the vias may be created by photochemical processes, which can become superior at very large array scales having high densities of extremely minute vias. In this case a finite thickness first metallization film is placed on the ceramic sheet (or body). An electrically insulating ceramic sheet or tape, suitable in a portion thereof to form a layer of a laminate electrical component and having a photosensitive binder, is placed over the metallization film. This photosensitive-binder ceramic sheet or tape is then patterned with a multiplicity of dots at regions where are desired vias by act of exposing the ceramic sheet or tape to radiation to which the photosensitive binder is sensitive through an optical pattern mask. Solvent is used to wash out the ceramic dielectric at the regions of the patterned dots where the photosensitive binder is ineffective to cohere the ceramic, producing thereby a ceramic sheet or tape layer with holes upon the first metallization plane. This laminate structure of the holed ceramic sheet or tape layer upon the first metallization plane upon a parallelepiped ceramic body is normally then fired so as to create a sintered body. Finally, a second metallization plane patterned into at least one electrically conductive pad is applied upon the sintered body, and into holes of the sintered holed ceramic sheet or tape layer, so as to create vias in the holes. In accordance with the preferred implementation of the invention, at least two of these vias will electrically redundantly connect the first metallization plane to the at least one electrically conductive pad of the second metallization plane.

The ceramic part may alternatively first be made without the top and/or the back metal, sintered, and then have the top and/or back metal added using a sputtering process. This is more complicated, and likely more expensive. However, it will be realized that the buried conductive plates, ceramic layers, and via interconnection of the present invention are totally compatible with many different types of surface metallizations.

There are typically some 6400 parts, or capacitors 1, per 2" width manufacturing workpiece bar as is illustrated in FIG. 4. A wafer bar of 5" width typically contains some 40,000 pieces. The length and width of each capacitor 1 when formed in green (unfired) ceramic is 0.025 inches (25 mils) by 0.025 inches (25 mils). The width of the separating cut (not yet made, typically made by a diamond saw) is 0.008 inches (8 mils) in each direction. The area of each capacitor 1 is approximately 0.000289 square inches, and the total area of all 6400 hundred capacitors upon the bar is 21 square inches. Note that the workpiece bar can be singulated before or after sintering using various standard means such a razor-edge knife, a diamond saw, or other conventional cutting and severing tools.

Another plan view of an entire un-diced wafer of a preferred embodiment of arrayed capacitors 1j (previously seen in FIG. 4) in accordance with the present invention is shown in FIG. 6. The many small vias 13a (or 13b) are in particular illustrated. The dimension E of the wafer is typically 5.5 inches; the dimension F 1.75 inches; the dimension G 1.75 inches; and the dimension H 2.0 inches. Other hole pitch and spacings are possible depending upon the particular capacitor being constructed (see FIGS. 1 and 2) and the metallization area requirements.

An exploded view of a portion of the un-diced wafer of the preferred embodiment of arrayed capacitors 1j shown in FIG. 6 is illustrated in FIG. 7. Regularly arrayed vias 13a (or 13b) (shown in FIGS. 3b and 3c) of which vias 13a1 (or 13b1) (typical) are exemplary are illustrated. The typical diameter of each via 13a (or 13b) is 0.002 inches (2 mils). The dimension I is typically 0.017 inches (17 mils); the dimension J 0.017 inches (17 mils); the dimension K 0.0085 inches (8.5 mils); and the dimension L 0.0085 inches (8.5 mils).

A major advantage of the preferred embodiment ceramic capacitor of the invention is the reduced or "pulled back" aspect of its surface metallization. The effect of the reduced area of surface metallization is diagrammatically illustrated in FIGS. 8 though 10. The reduction of the areas of the surface metallizations 11a, 11b is without effect on the capacitance; which is determined by the interior conductive planes 14a, 14b (shown in FIGS. 3b and 3c ).

A diagrammatic view of the application of a drop of epoxy adhesive 2 to a substrate 3 to which the ceramic chip capacitor 1 will subsequently be mounted is shown in FIG. 8. A diagrammatic view of a ceramic chip capacitor 1 in accordance with the present invention set upon a pool of epoxy 2 upon a substrate 3 is illustrated in FIG. 9a. A diagrammatic view of an undesirable "creep" of the epoxy adhesive 2 onto the electrically conductive upper surface pad 11a of a ceramic chip capacitor 1 in accordance with the present invention, or any similar capacitor of the prior art, is illustrated in FIG. 9b. FIG. 9c is a diagrammatic view showing, however, that the preferred embodiment of a ceramic chip capacitor 1 having a conductive upper surface metallization, or pad, 11a that is withdrawn from the edges helps to preclude that any excess epoxy adhesive 2 should extend onto the upper surface of the capacitor 1, and should thereafter interfere with electrical connection. A diagrammatic view of this electrical connection is shown in FIG. 10. Connection is made to the upper surface metallization, or pad, 11a of the preferred embodiment ceramic chip capacitor 1 by the soldered, or ultrasonically bonded, wire 4.

The "alignment fault tolerance" of the multiple vias is illustrated in FIG. 5, and again, in detail, in FIG. 11. Each interior metallization plane 14a, 14b within the ceramic capacitor 1 is redundantly electrically connected to a respective associated exterior pad 11a, 11b by plural (in FIG. 5 illustrated as two; FIG. 11 is turned 90°) vias of vias groups 13a1 and 13b1. By this construction the enhanced-capacitance ceramic capacitor may be reliably conventionally fabricated in the huge arrays (typically many thousands of capacitors) on workpiece "bars" as illustrated in FIG. 4 regardless than any single one via, for example illustrated the single via of via group 13a2 isolated in the expanded view of FIG. 11, may not be properly located. Additionally, the redundant vias make a low-resistance electrical connection useful at high frequencies.

Typically the "pin grid array" regular geometric pattern of closely-spaced vias results in at least two, and normally many more than two, vias making electrical connection between each external pad and its corresponding internal metallization plane (and vice versa). Massive parallelism, and redundancy, is not and should not be eschewed: it is perfectly acceptable for all aspects (including structural aspects) of capacitor performance that many hundreds of vias should be in electrical parallel.

Note that, although many vias such as those of via groups 13a1 and 13b1 (shown in FIG. 5) do make electrical connection to metallization, many others of the "pin grid array" of closely-spaced vias, such as those of via groups 13a2 and 13b2, do not. Typically more than 50% but less than 100%, and more commonly 70% to 90% of the vias are electrically connected, depending upon the design of the capacitor metallizations. (Conversely, typically more than 0% but less than 50%, and more commonly 30% to 10% of the vias are not electrically connected, again depending upon the design of the capacitor metallizations.)

The unused vias are "empty", and do not fill with metal during capacitor fabrication. They tend to fill up with ceramic, and to close, during fabrication, and this closure can be manipulated and promoted if desired. However, the empty vias do not cause any subsequent capacitor performance problems, and are harmless and vestigial artifacts of fabrication.

The purpose of the multiple regularly arrayed vias (best seen in FIGS. 4 and 5) is to permit the fabrication of diverse capacitors with the same via array. This is best illustrated in FIG. 7, where a number of (illustrated interior) metallization planes 14 are each redundantly electrically connected by vias such as via groups 13a1 (or 13b1). Other via groups, such as 13a2 (or 13b2) are empty, and unused.

The multiple vias result in at least two, and normally many more than two, vias making electrical connection between each external pad and its corresponding internal metallization plane (and vice versa) . Massive parallelism, and redundancy, is not, and should not be, eschewed in the present invention: it is perfectly acceptable for all aspects (including structural aspects) of capacitor performance that many hundreds of vias should be placed in electrical parallel.

In accordance with the preceding explanation, variations and adaptations of ceramic chip capacitors in accordance with the present invention will suggest themselves to a practitioner of the electrical component design arts. For example, ceramic chip capacitor of alternative volumes and external forms (other than single-plate capacitors) could be adapted to the principles of the present invention. For example, just one, or three or more, closely-spaced interior conductive planes could be used. Redundant connection to positionally-tolerant exterior pads could transpire through multiple redundant vias arrayed and arranged in diverse patterns.

According to these and other possible variations, the present invention should be determined in accordance with the following claims, only, and not solely in accordance with that embodiment within which the invention has been taught.

What is claimed is:

1. A ceramic capacitor comprising:

a ceramic body;

at least one exterior metallization area to which electrical connections are made on a portion of each of two opposite exterior substantially co-planar surfaces of the ceramic body;

at least one interior metallization region (i) interior to the body between the at least two exterior metallization areas, and thus more closely situated to each exterior metallization area than the exterior metallization areas are to each other, and (ii) imperfectly positionally aligned to at least one of the two exterior metallization areas so that the external area and internal region are not coextensive or do not completely overlap each other or are both not coextensive and incompletely overlapping; and a multiplicity of vias, located between the at least one exterior metallization area and the at least one interior metallization region in substantially a location and an area of a smaller of the at least one exterior metallization area and the at least one interior metallization region redundantly electrically connecting the at least one exterior metallization area to the at least one interior metallization region through most of the vias, but with at least one of the multiplicity of vias, failing to electrically connect the at least one exterior metallization area to the at least one interior metallization region with which it is imperfectly positionally aligned;

wherein the redundant electrical connections accorded by the multiplicity of vias permit that the at least one exterior metallization area is reliably electrically connected to the at least one interior metallization region regardless that the at least one exterior metallization area and the at least one interior metallization region should be imperfectly positionally aligned.

2. The ceramic capacitor according to claim 1 wherein the at least one exterior metallization area upon at least one exterior surface is smaller than the surface and is withdrawn from edges of the surface;

wherein the associated at least one interior metallization region is larger than is the at least one exterior metallization area.

3. A mounted ceramic capacitor comprising:

a ceramic body having top and bottom and side surfaces;

at least two exterior metallization areas to which electrical connections are made on a portion of each of said exterior top and bottom surfaces of the ceramic body, at least one exterior metallization area upon the top surface of the ceramic body being withdrawn from the side surfaces of the ceramic body;

a metallization region interior to the body, and thus more closely situated to each of the exterior metallization areas than the exterior metallization areas are to each other;

a multiplicity of vias electrically interconnecting the interior metallization region to at least one of said exterior metallization areas in a location where the interior and the at least one exterior metallizations are existing and opposed, thus necessarily in a location other than locations proximate to sides of the ceramic body, from which sides of the ceramic body the at least one top surface exterior metallization area is withdrawn; and an insulating adhesive mounting the ceramic body to an external substrate, the insulating adhesive connecting to the side surfaces of the ceramic body and, because of wicking, flowing over onto the top surface of the ceramic body;

wherein the at least one top-surface side-surface-withdrawn exterior metallization region is outside any top surface area of the ceramic body onto which the mounting insulating does wick, thus remaining fully accessible for electrical connection in the entirety of its area;

wherein by combination of (i) the at least one top-surface side-surface-withdrawn exterior metallization region and (ii) the multiplicity of interconnecting vias, reliable electrical connection are made through the ceramic body to a capacitor comprising the metallization region interior to the ceramic body.

4. The mounted ceramic capacitor according to claim 3 wherein there is a one-to-one correspondence between the external metallization areas on opposite sides of the ceramic body and a plurality of internal metallization regions.

5. The mounted ceramic capacitor according to claim 4 wherein the plurality of internal metallization regions out-number the external metallization areas on opposite sides of the ceramic body, the plurality of internal metallization regions electrically connecting through ones of the multiplicity of vias to at least one of said external metallization areas.

6. The mounted ceramic capacitor according to claim 3 wherein the ceramic body has sufficient thickness so as to permit routine handling of the ceramic capacitor without breakage.

7. A ceramic capacitor comprising:

a ceramic body having a finite thickness;

at least two exterior metallization areas to which electrical connection are made each on a portion of exterior surfaces of the ceramic body;

at least two interior metallization regions interior to the body, each of the at least two interior metallization regions being in part overlapping with other interior metallization regions while also extending so far in at least one direction and at some peripheral area so that an imaginary straight line can at some place be drawn perpendicular from each interior metallization region to an associated one of the at least two surface exterior metallization areas without intersecting at least one other of the interior metallization regions;

wherein the at least two interior metallization regions are by definition more closely situated to each other in the area of their partial overlap than would be the exterior metallization areas upon the first surface to a hypothetical metallization area existing on a second exterior surface of the ceramic body which is opposite to the first exterior surface; and multiple pluralities of vias, each plurality of vias respectively redundantly electrically connecting a corresponding respective one of the at least two exterior metallization areas to a corresponding respective one of the at least two interior metallization regions;

wherein some of the vias of the plurality do not make electrical connection, while other, remaining, vias redundantly make electrical connection between corresponding ones of the exterior metallization areas and the interior metallization regions, the multiple pluralities of vias thus serving to reliably interconnect exterior metallization areas and interior metallization regions.

8. The ceramic capacitor according to claim 7 wherein there is a one-to-one correspondence between the external metallization areas and the internal metallization regions.

9. The ceramic capacitor according to claim 7 wherein a number of internal metallization regions exceeds a number of external metallization areas, plural internal metallization regions electrically connecting through plural of the pluralities of vias to one external metallization area.

10. An enhanced-capacitance ceramic capacitor with exterior pads, the capacitor comprising:

a ceramic body;

exterior metallization pads on surfaces of the body, to which pads electrical connections made;

a plurality of interior metallization regions located interior to the body; and a plurality of vias electrically connecting each one of the plurality of interior metallization regions each to, at an area of external egress of each via, an associated one of the exterior metallization pads so that (i) each pad is redundantly electrically connected to an associated one of the interior metallization regions, and (ii) each of the pads is much larger than the egress area of any one via while (iii) some one or ones of the plurality of vias fail to interconnect an associated exterior metallization pad to an associated interior metallization region;

wherein the capacitor is simultaneously of enhanced capacitance due to the interior metallization regions while supporting reliable electrical connection to the interior metallization regions both because (i) the vias are redundant, (ii) the pads are larger than the egress areas of the vias, and are thus making electrical connection to be positionally tolerant of a positional registration between the exterior metallization pads and the interior metallization regions.

11. The ceramic capacitor according to claim 10 wherein at least one of the exterior metallization pads upon at least one surface is not substantially co-extensive with the surface, but is substantially smaller in area than is the surface and is in particular withdrawn from edges of the surface;

wherein the interior metallization regions are larger in area than is the at least one exterior metallization pad.

12. An enhanced-capacitance ceramic capacitor with exterior pads, the capacitor comprising:

a ceramic body;

exterior metallization pads on surfaces of the body to which pads electrical connections are made;

a plurality of interior metallization regions located interior to the body; and a plurality of vias electrically connecting each one of the plurality of interior metallization regions each to, at an area of external egress of each via, an associated one of the exterior metallization pads so that (i) each pad is redundantly electrically connected to an associated one of the interior metallization regions, and (ii) each of the pads is much larger than the egress area of any one via;

wherein the capacitor is simultaneously of enhanced capacitance due to the interior metallization regions while supporting reliable electrical connection to, ultimately, the interior metallization regions because both (i) the vias are redundant, and (ii) the pads are larger than the egress areas of the vias, and are thus positionally tolerant of electrical connection; and wherein the plurality of vias electrically interconnect each of the interior metallization regions to the associated one of the exterior pads in a location where metallization of both region and pad are existing and opposed, thus necessarily in a location other than locations proximate to sides of the ceramic body from which sides the at least one exterior metallization pad is withdrawn.

13. A ceramic capacitor comprising:

a ceramic body having top and bottom and side surfaces;

first and second exterior metallization areas to which electrical connections are made, each borne on opposed surfaces of the ceramic body;

a first metallization region interior to the body, and more closely situated to each exterior metallization area than the exterior metallization areas are to each other;

a multiplicity of vias electrically interconnecting the interior metallization region to the first exterior metallization area in a location where both the first exterior metallization area and the first metallization region interior to the ceramic body are existing and opposed;

wherein the multiplicity of interconnecting vias promotes reliable electrical connection of the first exterior metallization area to the first metallization region interior to the ceramic body.

14. The ceramic capacitor according to claim 13 further comprising a second metallization region interior to the body, a multiplicity of vias electrically interconnecting the second metallization region interior to the body to the second exterior metallization area in a location where both the second exterior metallization area and the second metallization region interior to the ceramic body are existing and opposed.

15. The ceramic capacitor of claim 14 wherein there is a one-to-one correspondence between the external metallization areas on opposite sides of the ceramic body and the plurality of internal metallization regions.

16. The ceramic capacitor of claim 14 wherein a portion of said ceramic body embraced between said first exterior metallization area and said first interior metallization region, does not overlap a portion of said ceramic body embraced between said second exterior metallization area and said second interior metallization region.

17. The ceramic capacitor of claim 14 wherein the portion of said ceramic body embraced between the surface bearing said first exterior metallization area and all interior metallization regions electrically connected thereto, does not overlap the portion of said ceramic body embraced between the surface bearing said second exterior metallization area and all interior metallization regions electrically connected thereto.

18. The ceramic capacitor according to claim 13 further comprising a plurality of further internal metallization regions which outnumber the external metallization areas on opposite sides of the ceramic body, the plurality of internal metallization regions electrically connecting through ones of the multiplicity of vias to at least one external metallization area.

19. The ceramic capacitor according to claim 13 wherein the ceramic body has sufficient thickness so as to permit routine handling of the ceramic capacitor without breakage.

20. The ceramic capacitor according to claim 13 wherein the first exterior metallization area is upon the top surface, is not substantially co-extensive with the top surface, and is withdrawn from side edges of the top surface.

21. The ceramic capacitor according to claim 20 wherein the interior metallization region is larger than the exterior metallization area upon the top surface.

22. A ceramic capacitor comprising:

a ceramic body having top and bottom and side surfaces;

first and second exterior metallization areas to which electrical connections made, each borne on opposed surfaces of the ceramic body;

a first metallization region interior to the body, and more closely situated to each exterior metallization area than the exterior metallization areas are to each other; and a via electrically interconnecting the interior metallization region to the first exterior metallization area in a location where both the first exterior metallization area and the metallization region interior to the ceramic body are existing and opposed;

wherein the portion of said ceramic body embraced between the surface bearing said first exterior metallization area and the interior metallization region connected thereto, does not overlap the portion of said ceramic body embraced between the surface bearing said second exterior metallization area and any interior structures electrically connected thereto.

23. The ceramic capacitor according to claim 22 further comprising a second metallization region interior to the body, a via electrically interconnecting the second metallization region interior to the body to the second exterior metallization area in a location where both the second exterior metallization area and the second metallization region interior to the ceramic body are existing and opposed.

24. The ceramic capacitor of claim 23 wherein there is a one-to-one correspondence between the external metallization areas on opposite surfaces of the ceramic body and the plurality of internal metallization regions.

25. The ceramic capacitor according to claim 22 further comprising a plurality of further internal metallization regions which outnumber the external metallization areas on opposite sides of the ceramic body, the plurality of internal metallization regions electrically connecting through ones of a multiplicity of additional vias to at least one of said external metallization areas.

26. The ceramic capacitor according to claim 22 wherein the ceramic body has sufficient thickness so as to permit routine handling of the ceramic capacitor without breakage.

27. The ceramic capacitor according to claim 22 wherein an exterior metallization area is upon the top surface, is not substantially co-extensive with the top surface, and is withdrawn from side edges of the top surface.

28. The ceramic capacitor according to claim 27 wherein the interior metallization region is larger than the exterior metallization area upon the top surface.

* * * * *

UNITED STATES PATENT AND TRADEMARK OFFICE
CERTIFICATE OF CORRECTION

| | | |
|---|---|---|
| PATENT NO. | : 6,366,443 B1 | |
| APPLICATION NO. | : 08/987463 | |
| DATED | : April 2, 2002 | |
| INVENTOR(S) | : Daniel Devoe, Alan Devoe and Lambert Devoe | |

It is certified that error appears in the above-identified patent and that said Letters Patent is hereby corrected as shown below:

Page 1, in the Abstract,
Line 8, delete "by (ii) punching,", insert --by (i) punching,--.
Line 20, after "present.", insert a new paragraph --No longer being required to be maximally large for optimum capacitance, the exterior pads are well-sized and well-located, and are preferably withdrawn from the edges of the capacitor both so as to prevent wicking of epoxy adhesive and so as to permit rounding the edges of the capacitor in order to inhibit chipping. The reduced-size pads are nonetheless much larger than are the multiple vias redundantly electrically connecting to each, and are readily reliably electrically connected, normally by smoldering.--

Column 2, line 11, delete "cassettes can", insert --cassettes that can--.

Column 3, line 19, delete "microprocessors arc", insert --microprocessors are--.

Column 4, line 45, delete "these advices is", insert --these devices is--.

Column 5, line 5, delete "ceramic capacitors may", insert --ceramic capacitor may--.

Column 6, line 34, delete "range from of", insert --range of from--.

Column 7, line 11, delete "of 10 separation", insert --of separation--.

Column 9
Line 7, delete "capacitance nor (ii)", insert --capacitance or (ii)--.
Line 19, delete "delaminate, nor to", insert --delaminate, or to--.

Column 11, line 41, delete "between at opposed", insert --between opposed--.

Column 12
Line 21, delete "create Vias in", insert --create vias in--.
Line 63, delete "making -a preferred", insert --making a preferred--.

Column 13, line 65, delete "of 5 mil is thickness", insert --of 5 mils thickness--.

Column 14
Line 45, delete "and id comes", insert --and 1d comes--.
Line 51, delete "capacitor" if shown", insert --capacitor" is shown--.

UNITED STATES PATENT AND TRADEMARK OFFICE
CERTIFICATE OF CORRECTION

PATENT NO. : 6,366,443 B1
APPLICATION NO. : 08/987463
DATED : April 2, 2002
INVENTOR(S) : Daniel Devoe, Alan Devoe and Lambert Devoe It is certified that error appears in the above-identified patent and that said Letters Patent is hereby corrected as shown below:

Column 15
Line 31, delete "4 mails", insert --4 mils--.
Line 33, delete "this advantages can", insert --this advantage can--.
Line 46, delete "13a, 13b.", insert --13a, 13b (shown in Figs. 3a and 3b) of which illustrated vias 13a1, 13b1 are exemplary.--
Line 47, delete "simply metallizations", or", insert --simply "metallizations", or--.
Line 56, delete "vias arc typically", insert --vias are typically--.

Column 17
Line 47, delete "regardless than any", insert --regardless that any--.

Column 20
Line 57, Claim 10, line 5, delete "connections made", insert --connections are made--.

Column 22
Line 49, Claim 22, line 4, delete "connections made", insert --connections are made--.

Signed and Sealed this

Seventeenth Day of October, 2006

JON W. DUDAS
*Director of the United States Patent and Trademark Office*